United States Patent
McLear et al.

(10) Patent No.: US 11,271,290 B2
(45) Date of Patent: Mar. 8, 2022

(54) RING TYPE WEARABLE TERMINAL AND FLEXIBLE SUBSTRATE

(71) Applicant: MTG Co., Ltd., Aichi (JP)

(72) Inventors: John McLear, West Yorkshire (GB); Stuart Childs, West Yorkshire (GB)

(73) Assignee: MTG Co., Ltd., Aichi (JP)

( * ) Notice: Subject to any disclaimer, the term of this patent is extended or adjusted under 35 U.S.C. 154(b) by 0 days.

(21) Appl. No.: 16/015,836

(22) Filed: Jun. 22, 2018

(65) Prior Publication Data
US 2019/0006742 A1    Jan. 3, 2019

Related U.S. Application Data

(60) Provisional application No. 62/526,816, filed on Jun. 29, 2017.

(51) Int. Cl.
*H01Q 1/27* (2006.01)
*A44C 9/00* (2006.01)
(Continued)

(52) U.S. Cl.
CPC .......... *H01Q 1/273* (2013.01); *A44C 9/0015* (2013.01); *A44C 9/0053* (2013.01); *A44C 9/02* (2013.01);
(Continued)

(58) Field of Classification Search
CPC .. H01Q 1/27; H01Q 1/22; H01Q 7/00; H05K 2201/10098; A44C 9/00; A44C 9/02; G06K 19/07; G06F 1/163
See application file for complete search history.

(56) References Cited

U.S. PATENT DOCUMENTS

| | | | |
|---|---|---|---|
| 6,278,873 B1* | 8/2001 | Itakura | G04G 17/02 455/347 |
| 6,928,734 B1* | 8/2005 | West | A44C 9/00 29/896.412 |

(Continued)

FOREIGN PATENT DOCUMENTS

| | | |
|---|---|---|
| CN | 101005800 A | 7/2007 |
| CN | 204013533 U | 12/2014 |

(Continued)

OTHER PUBLICATIONS

Office Action of corresponding AU Application No. 2019202747, dated Mar. 23, 2020, 4 pages.

(Continued)

*Primary Examiner* — Hasan Islam
(74) *Attorney, Agent, or Firm* — Muncy, Geissler, Olds & Lowe, P.C.

(57) ABSTRACT

A ring type wearable terminal is provided with a ring and a communication unit that is housed in the ring. The communication unit is provided with a ring-shaped flexible substrate. The flexible substrate is provided with a bonding portion formed such that the bonding portion can be bonded at a plurality of different positions in a longitudinal direction in accordance with the size of the ring. By changing a bonding position of the bonding portion, the diameter of the flexible substrate formed in a ring shape can match the size of the ring. Thereby, a single flexible substrate can be used for a ring of multiple sizes, and an increase in the manufacturing cost when offering a size range of multiple sizes can thus be prevented.

8 Claims, 8 Drawing Sheets

(51) Int. Cl.
*A44C 9/02* (2006.01)
*H01Q 1/22* (2006.01)
*H01Q 7/00* (2006.01)
*H05K 1/02* (2006.01)

(52) U.S. Cl.
CPC ............ *H01Q 1/2225* (2013.01); *H01Q 7/00* (2013.01); *H05K 1/028* (2013.01); *H05K 2201/056* (2013.01); *H05K 2201/10098* (2013.01)

(56) References Cited

U.S. PATENT DOCUMENTS

| | | | |
|---|---|---|---|
| 10,317,940 B2* | 6/2019 | Eim ........................ | G06F 1/163 |
| 2002/0089461 A1* | 7/2002 | Mimura ................... | H01Q 1/38 |
| | | | 343/742 |
| 2015/0220109 A1* | 8/2015 | von Badinski ......... | G01P 15/00 |
| | | | 340/539.12 |
| 2016/0020832 A1* | 1/2016 | Ting ..................... | H04B 5/0031 |
| | | | 455/41.1 |
| 2017/0358841 A1* | 12/2017 | Chen ........................ | H01B 3/30 |
| 2019/0181544 A1* | 6/2019 | Kim ......................... | H01Q 1/38 |

FOREIGN PATENT DOCUMENTS

| | | |
|---|---|---|
| JP | 2015093004 A | 5/2015 |
| KR | 20070109866 A | 11/2007 |
| WO | WO2015/129556 A1 | 9/2015 |
| WO | WO 2017/222217 A1 | 12/2017 |
| WO | WO2017/222217 A1 | 12/2017 |
| WO | WO-2017/222217 A1 | 12/2017 |
| WO | WO-2018/020055 | 2/2018 |
| WO | WO 2018/020055 A1 | 2/2018 |

OTHER PUBLICATIONS

Chinese Office Action dated Nov. 6, 2020 in CN Application No. 201710884442.0, w/English Translation (17 pages).
Office Action of corresponding Chinese Patent Application No. 201710884442.0 and English translation, dated Apr. 6, 2021, 13 pages.
Office Action and Search Report issued in CN201710884442.0 dated Aug. 6, 2021, 12 pages.

* cited by examiner

RING TYPE WEARABLE TERMINAL AND FLEXIBLE SUBSTRATE

CROSS REFERENCE TO RELATED APPLICATIONS

This application claims priority of U.S. Provisional Application No. 62/526,816 filed on Jun. 29, 2017 under 35 U.S.C. § 119(e), the entire contents of all of which are hereby incorporated by reference.

BACKGROUND OF THE INVENTION

1. Field of the Invention

The present invention relates to a ring type wearable terminal and a flexible substrate.

2. Description of the Related Art

When getting close to a reader-writer, IC cards wirelessly communicate with the reader-writer and transmit and/or receive various types of data. Since IC cards are easy to handle, IC cards are widely used as access management cards, employee cards, boarding cards for transportation systems, credit cards, etc.

Rings are known that are provided with the same features as those of IC cards. Patent document No. 1 discloses a ring type RFID data carrier where an annular antenna is connected to an exterior body incorporating an IC chip. This ring is convenient since wearing this ring no longer requires IC cards to be taken out from a bag or clothes when going through an automatic ticket gate for a railroad or when paying for a purchase.

[Patent Document No. 1] JP 2015-93004

Wearing a ring type data carrier makes it easier to use the features of the data carrier. However, if the size does not fit a finger, the ring type data carrier may fall from the finger and get lost. In order for a ring type data carrier to be widely used regardless of gender, it is necessary to prepare ring type data carries in a variety of sizes. A ring according to Patent document No. 1 requires an annular antenna in different sizes. However, it is understood that manufacturing cost is increased in that case.

SUMMARY OF THE INVENTION

In this background, a purpose of the present invention is to provide a ring type wearable terminal that allows for a size range for multiple sizes while preventing an increase in the manufacturing cost.

An embodiment of the present invention relates to a ring type wearable terminal. This ring type wearable terminal is provided with a ring and a communication unit that is housed in the ring. The communication unit is provided with a ring-shaped flexible substrate. The flexible substrate is provided with a bonding portion formed such that the bonding portion can be bonded at a plurality of different positions in a longitudinal direction in accordance with the size of the ring.

According to the present embodiment, by adjusting a bonding position of the bonding portion, the size of the ring-shaped flexible substrate can be changed in accordance with the ring. This allows the same flexible substrate to be used for a ring in a different size and thus allows for a size range for multiple sizes while preventing an increase in the manufacturing cost.

Another embodiment of the present invention also relates to a ring type wearable terminal. The ring type wearable terminal includes: a first ring; a second ring whose inner and outer diameters are smaller than those of the first ring; and a communication unit that is housed in the first ring or the second ring. The communication unit is provided with a ring-shaped flexible substrate. The flexible substrate is provided with a bonding portion formed such that the bonding portion can be bonded at a plurality of different positions in a longitudinal direction in accordance with the size of the ring.

According to the present embodiment, the size of the ring-shaped flexible substrate can be changed in accordance with each of the first ring and the second ring. Thereby, a single flexible substrate can be used for either of the first ring and the second ring, which have different sizes, and an increase in the manufacturing cost when offering a size range of multiple sizes can thus be prevented.

According to the present invention, a ring type wearable terminal can be provided that allows for a size range for multiple sizes while preventing an increase in the manufacturing cost.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

In the following embodiments, like numerals represent like constituting elements, and duplicative explanations will be omitted. For the sake of ease of explanation, some constituting elements are appropriately omitted in the figures.

First Embodiment

A ring type wearable terminal according to a first embodiment is provided with a first ring that has a recessed portion formed on a side surface thereof, a second ring that is bonded to the first ring and that covers the recessed portion, and a communication unit that is housed in the recessed portion of the first ring. The communication unit is an IC tag that includes an IC chip and an antenna. The first ring and the second ring are bonded by an adhesive agent that fills the recessed portion. Compared to a case where the adhesive agent is applied such that bonding surfaces come into contact at the surfaces, the bonding strength between the first ring and the second ring can be improved by increasing the amount of the adhesive agent. Also, the communication unit is tightly fixed to the recessed portion and protected by the adhesive agent. This configuration allows the strength of the ring type wearable terminal to be improved.

Figure 1:
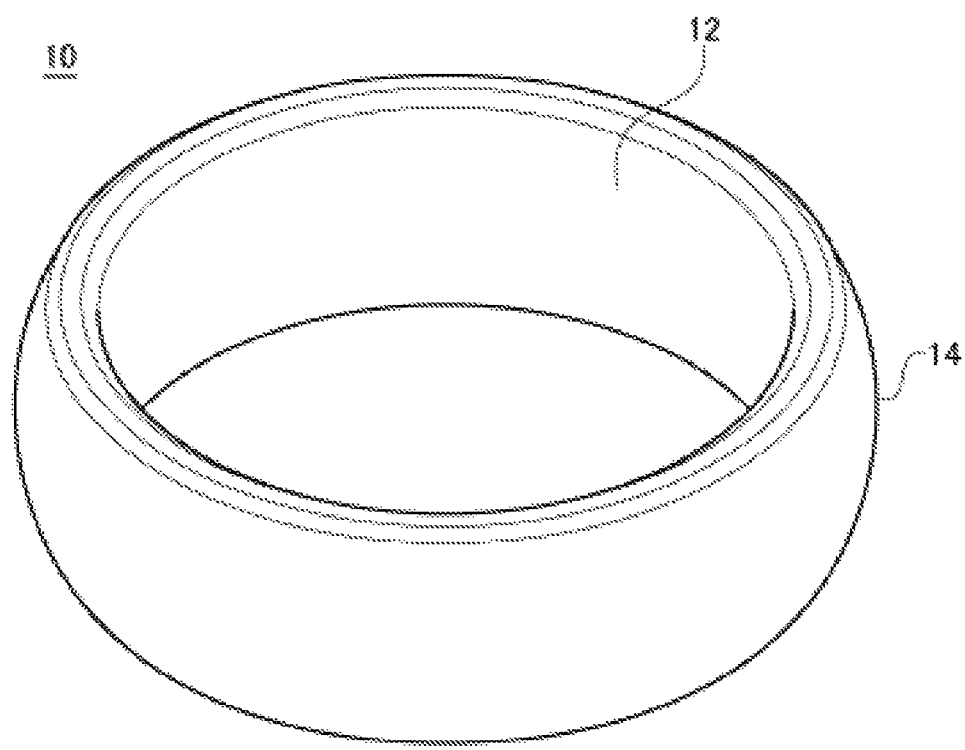
FIG. 1 is a perspective view of a ring type wearable terminal according to a first embodiment.
Figure 2:
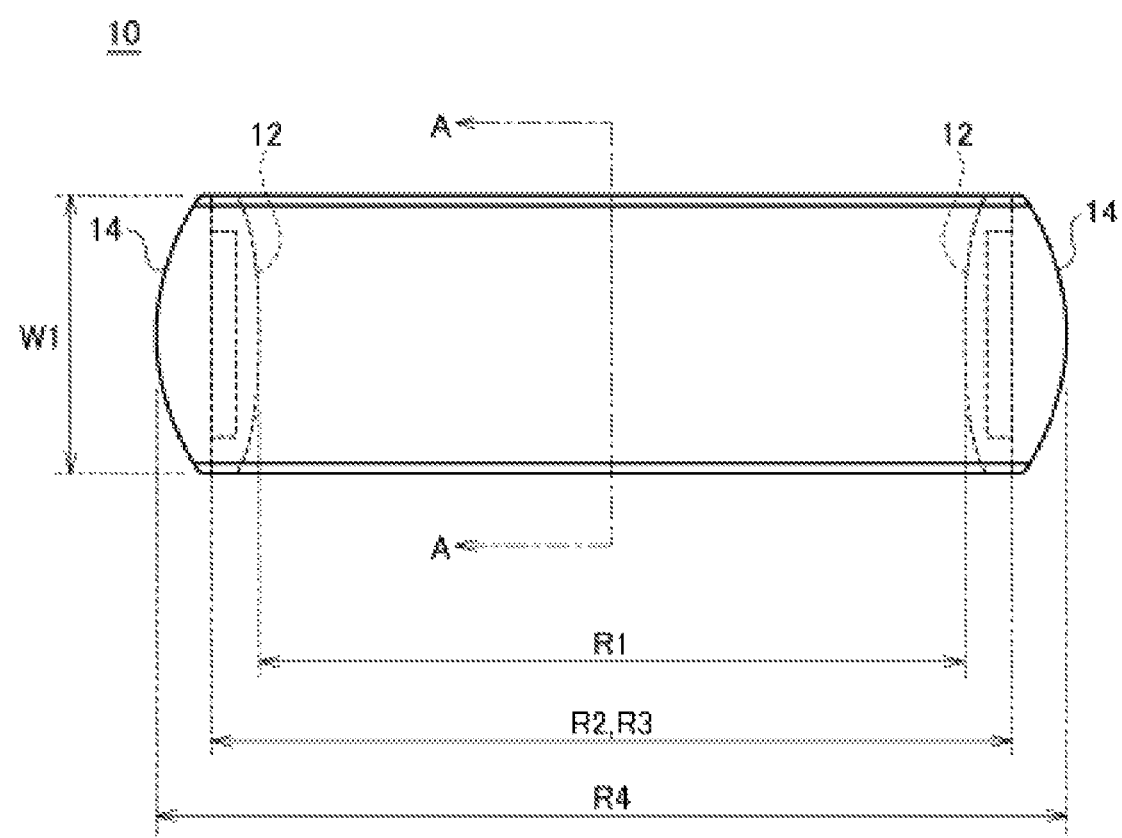
FIG. 2 is a lateral view of a ring type wearable terminal according to the first embodiment.

FIG. 1 is a perspective view of a ring type wearable terminal 10 according to the first embodiment, and FIG. 2 is a lateral view of the ring type wearable terminal 10. The ring type wearable terminal 10 is provided with a first ring 12 and a second ring 14 that is bonded to the outside of the first ring 12. The first ring 12 and the second ring 14 are formed of high-strength ceramics made of zirconia to which yttrium oxide is added. The first ring 12 and the second ring 14 are set to have a width W1 of 7.8 mm. The first ring 12 is set to have an internal diameter R1 of 20.2 mm and an outer diameter R2 of 23.2 mm. The second ring 14 is set to have an internal diameter R3 of 23.2 mm and an outer diameter R4 of 26.0 mm. The respective diameters of the first ring 12 and the second ring 14 are changed in accordance with the size of the rings.

Figure 3:
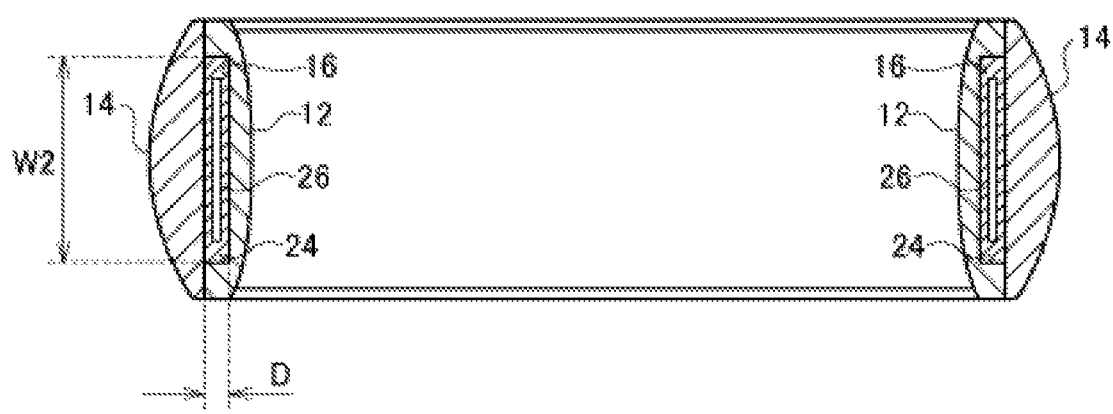
FIG. 3 is a cross sectional view along A-A of FIG. 2.
Figure 4:
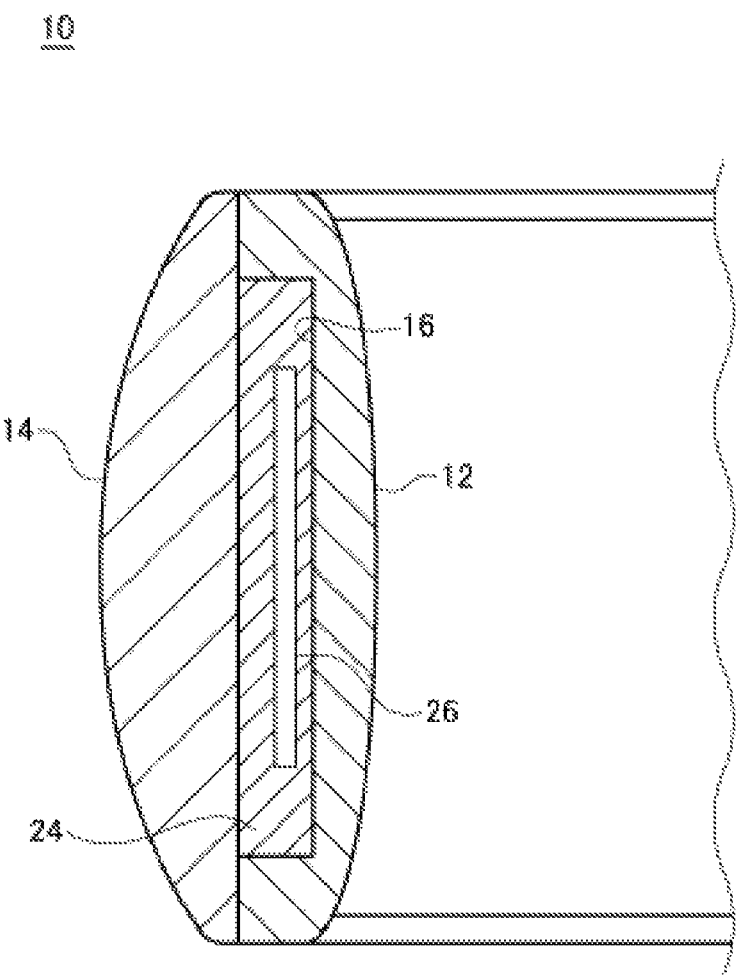
FIG. 4 is a partial enlarged view of FIG. 3.

FIG. 3 is a cross sectional view along A-A of FIG. 2, and FIG. 4 is a partial enlarged view of FIG. 3. On the outer peripheral surface of the first ring 12, a recessed portion 16 is formed on the whole circumference. The recessed portion 16 houses a communication unit 26, which is described later, and is covered by the second ring 14. The recessed portion 16 is set to have a width W2 of 6 mm and a depth D of 1.2 mm. The recessed portion 16 is filled with an adhesive agent 24. The adhesive agent 24 filling the recessed portion 16 bonds the first ring 12 and the second ring 14 and fixes the communication unit 26 to the recessed portion 16. Also, the adhesive agent 24 absorbs an impact caused by coming into contact with a reader-writer or the like so as to protect the communication unit 26. The adhesive agent 24 is an epoxy resin-based adhesive agent.

Figure 5:
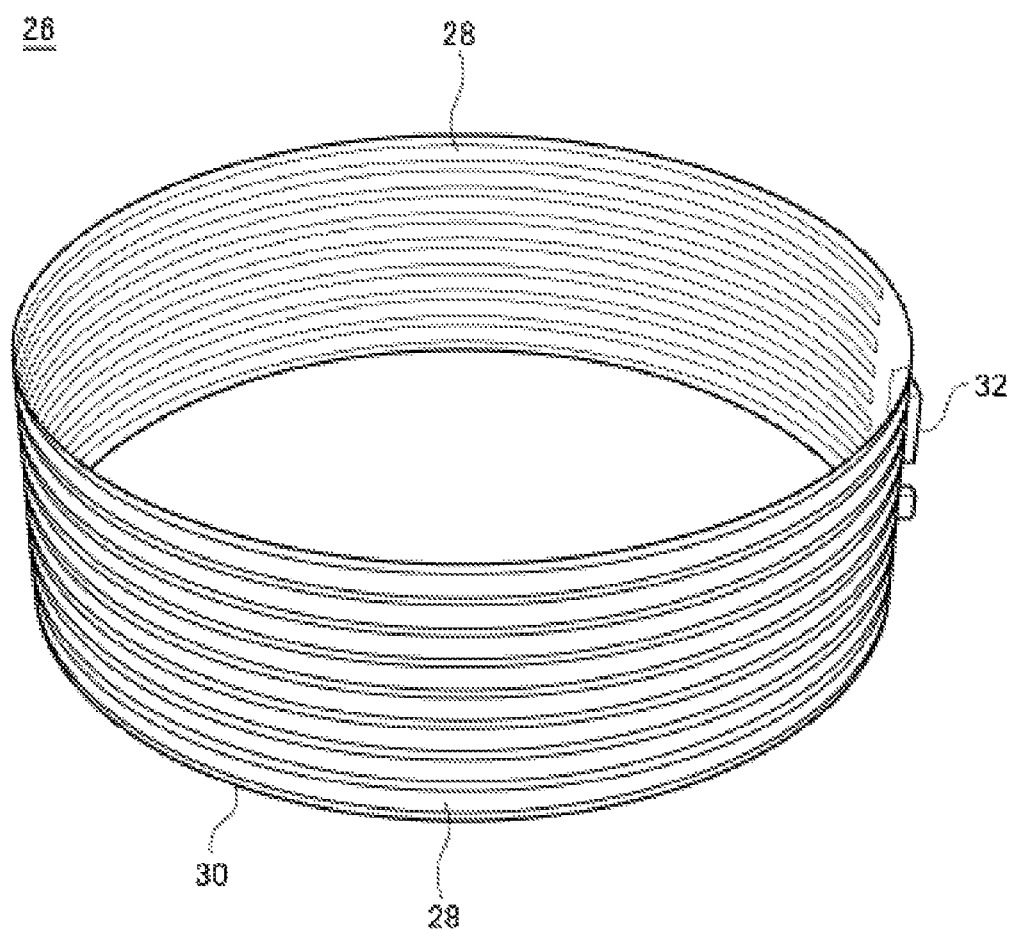
FIG. 5 is a perspective view of a communication unit according to the first embodiment.

FIG. 5 is a perspective view of the communication unit 26 according to the embodiment. The communication unit 26 is provided with a flexible substrate 30 and an IC chip 32 provided in the flexible substrate 30. The end portions of the flexible substrate 30 are connected to each other to form a ring shape. An antenna 28 is formed on each surface of the flexible substrate 30. The IC chip 32 includes a CPU, a memory, a reception unit, and a transmission unit and is connected to the antenna 28. The IC chip 32, using prior arts, operates by electrical power generated by the antenna 28 that has received a radio wave from the reader-writer and transmits and/or receives various types of data to/from the reader-writer.

Figure 6:
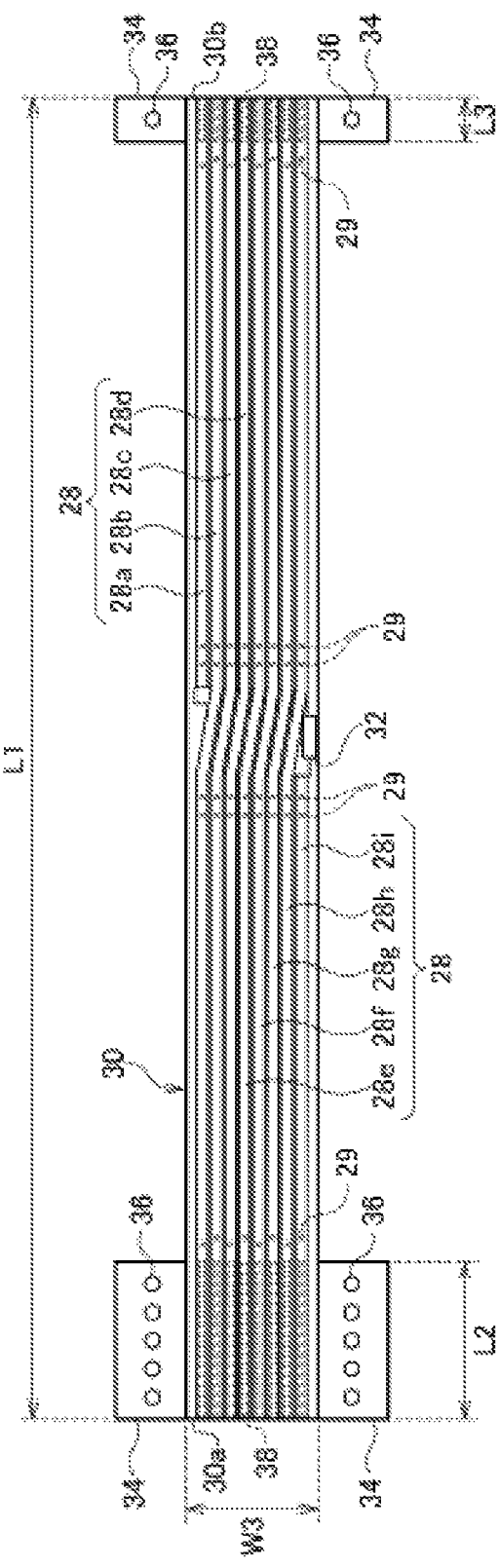
FIG. 6 is a plan view showing a condition before a flexible substrate according to the first embodiment is formed into a ring shape.

FIG. 6 is a plan view showing a condition before the flexible substrate 30 according to the first embodiment is formed into a ring shape. The flexible substrate 30 is set to have a width W3 of 5.9 mm and a length L1 of 75 mm. On a first surface of the flexible substrate 30 on the side where the IC chip 32 is provided, a plurality of linear patterns 28a through 28i that form the antenna 28 are formed. On a second surface of the flexible substrate 30, linear patterns of almost the same shape are formed at a position where the patterns overlap with the patterns on the first surface when viewed in a plan view. The linear patterns on both surfaces are connected through a plurality of connection holes 29 formed in the flexible substrate 30. The linear patterns 28a and 28i located at the ends in the width direction extend in the longitudinal direction from respective end portions of the flexible substrate 30 to the central part thereof and are connected to the IC chip 32. The linear patterns 28b through 28h located between these two linear patterns are formed such that the linear patterns 28b extend in a parallel manner from one end to the other end of the flexible substrate 30 while being shifted by one linear pattern at a central portion of the flexible substrate 30.

An end portion of each linear pattern is referred to as a bonding portion 38, which is bonded to another linear pattern. At each end portion of the flexible substrate 30 in the longitudinal direction, a positioning portion 34 projecting toward the outside from a side edge in the width direction is formed. A positioning portion 34 on the side of one end 30a is set to have a length L2 of 7 mm and forms five positioning holes 36 lines up in the longitudinal direction. A positioning portion 34 on the side of the other end 30b is set to have a length L3 of 2 mm and forms one positioning hole 36.

When the ends of the flexible substrate 30 are bonded, both of the positioning portions 34 are overlapped with each other such that the flexible substrate 30 has a circumference that matches the size of the ring and are fixed with a pin passing through the positioning holes 36. Under this condition, the bonding portions 38 at the ends are soldered to form the flexible substrate 30 into a ring shape. The linear pattern 28a is bonded, on the side of the other end 30b, to the linear pattern 28b on the side of the end 30a so as to form a single loop. In the same way, the linear patterns 28b through 28h are bonded, on the side of the other end 30b, to the linear patterns 28c through 28i, respectively, so as to form a plurality of loops. Such a structure allows the linear patterns 28a through 28i to form a single loop antenna where both ends of the linear patterns are connected to the IC chip 32 being wound in a coil shape while the flexible substrate 30 is in a ring shape. When the pin inserted in the positioning holes 36 is removed and the positioning portions 34 are detached from the flexible substrate 30 after both of the ends are bonded, a condition shown in FIG. 5 is obtained.

On the positioning portion 34 on the side of the end 30a of the flexible substrate 30, positioning holes 36 are formed side by side at a center-to-center distance of 1.2 mm in the longitudinal direction. This allows the circumference of the flexible substrate 30 to be adjusted at intervals of 1.2 mm in accordance with the size of the ring by changing the positioning holes 36 to be overlapped at the time of bonding. Since a single flexible substrate 30 can adapt to rings of multiple sizes, the manufacturing cost of a ring can be reduced in the manufacturing of multiple ring type wearable terminals of different sizes, compared to a case of manufacturing a flexible substrate 30 where the pattern of an antenna 28 and the entire length vary depending on a size. An adaptable size can be changed by changing the length L1 of the flexible substrate 30, the lengths L2 and L3 of the positioning portions 34, the number of the positioning holes 36, or the like.

An explanation will be given of a method for manufacturing the ring type wearable terminal 10. First, a rod-like jig whose outer diameter becomes larger gradually from one end to the other end is prepared. This jig is inserted into a first ring 12, and the first ring 12 is fixed to the jig at a position where the diameters match. Then, a communication unit 26 including a ring-shaped flexible substrate 30 where a bonding portion 38 is bonded in accordance with the size of the ring is put in a recessed portion 16 of the first ring 12. Under this condition, an adhesive agent 24 is applied to the entire outer side of the first ring 12 in a heaped manner, and the recessed portion 16 is filled with the adhesive agent 24. Then, a second ring 14 is placed on the outer side of the first ring 12. Once the adhesive agent 24 is hardened, the first ring 12 and the second ring 14 become bonded, and the communication unit 26 becomes fixed to the recessed portion 16. The adhesive agent 24 of the recessed portion 16 covers the entirety of the communication unit 26 and absorbs an impact received by coming into contact with a reader-writer or the like so as to protect the communication unit 26.

After the adhesive agent 24 is hardened, the first ring 12 and the second ring 14 are removed from the jig, and the respective outer peripheral surfaces are polished. At this time, the polishing is performed such that a part of the adhesive agent 24 that has leaked from between the first ring 12 and the second ring 14 is removed and the respective outer peripheral surfaces of the first ring 12 and the second ring 14 become smoothly continuous. Through these steps, the first ring 12 and the second ring become tightly bonded, and the ring type wearable terminal 10 smoothly finished without bumps on the surface can be manufactured.

The actual usage and effects brought by the above configuration are as shown in the following. A user wears a ring type wearable terminal 10 in his/her finger. By putting a hand with the finger wearing the ring type wearable terminal 10 closer to a reader-writer, reading at an automatic ticket gate, payment for a purchase, etc., can be easily performed. Also, manufactures of ring type wearable terminals 10 are able to allow a single flexible substrate 30 to be adaptable to multiple ring sizes and thus able to reduce the manufacturing cost when offering a size range of multiple sizes.

Shown below is a variation of the first embodiment. The recessed portion 16 is formed in the first ring 12. Alternatively, a recessed portion may be formed in the second ring 14. Alternatively, a recessed portion may be formed on each of the first ring 12 and the second ring 14. In either case, the first ring 12 and the second ring 14 are tightly bonded as in the same way as in the embodiment. The color of the first ring 12 and the color of the second ring 14 can be obviously any color. From the fashion's perspective, the colors may be the same color or, conversely, a combination of greatly different colors as those in a complementary color relationship.

Second Embodiment

A ring type wearable terminal according to a second embodiment is different from that of the first embodiment in that a notch to be filled with an adhesive agent 24 is formed in at least either one of a first ring 12 and a second ring 14.

Figure 7:
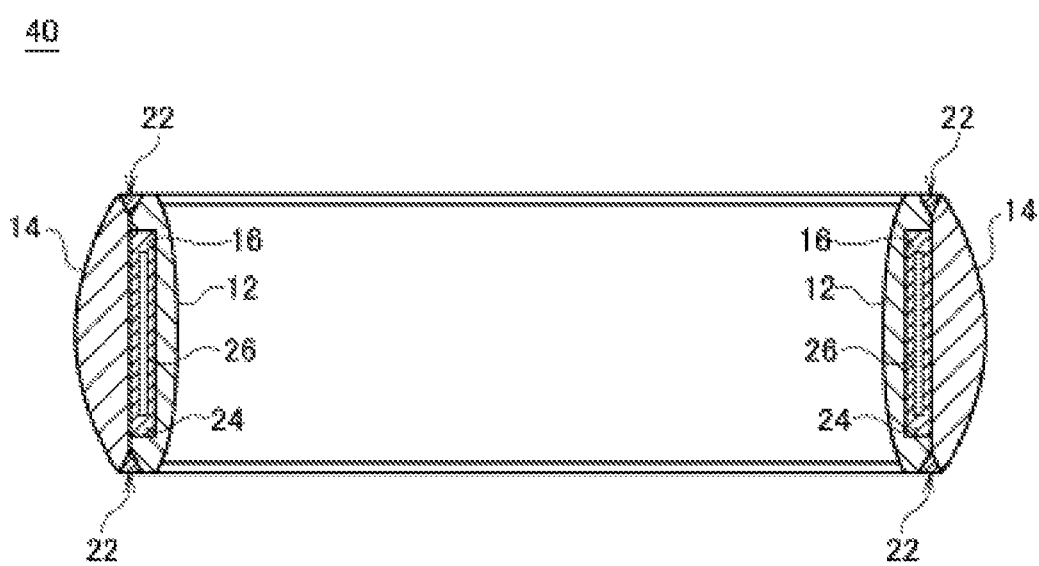
FIG. 7 is a cross sectional view of a ring type wearable terminal according to a second embodiment.
Figure 8:
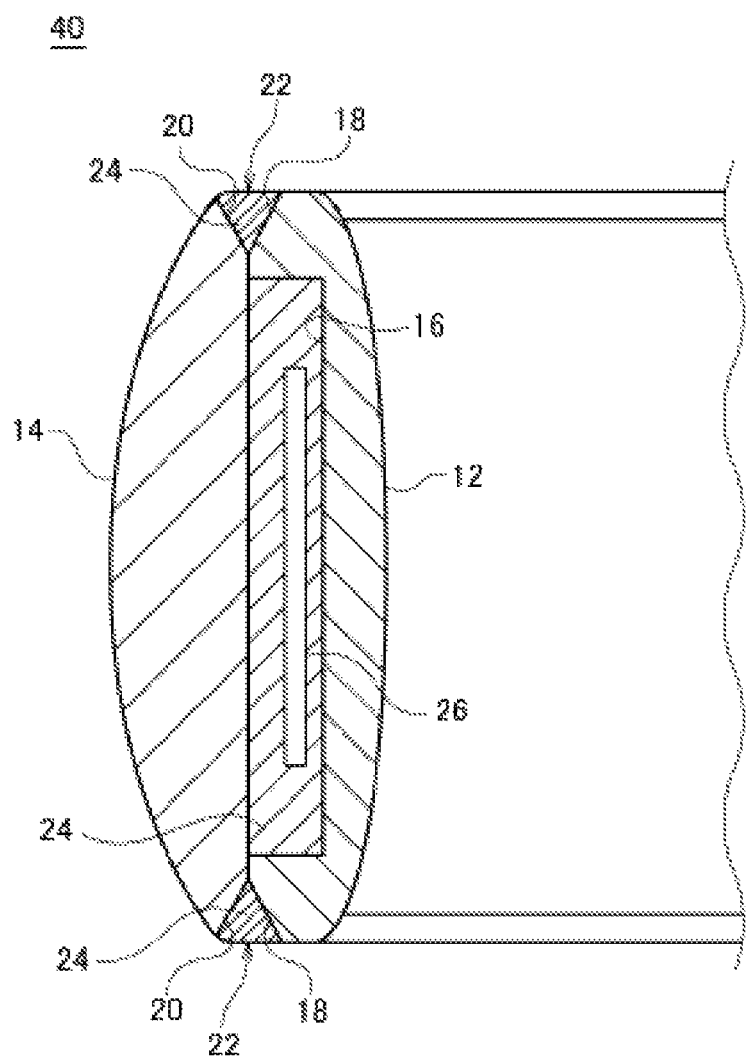
FIG. 8 is a partial enlarged view of FIG. 7.

FIG. 7 is a cross sectional view of a ring type wearable terminal 40 according to the second embodiment, and FIG. 8 is a partial enlarged view of FIG. 7. On each side edge portion of the first ring 12, an inner side notch 18 is formed on the whole circumference. The inner side notch 18 includes an inclined surface formed such that the outer diameter of the first ring 12 becomes smaller toward the side edge. On each side edge portion of the second ring 14, an outer side notch 20 is formed on the whole circumference. The outer side notch 20 includes an inclined surface formed such that the inner diameter of the second ring 14 becomes larger toward the side edge. When the first ring 12 and the second ring 14 are bonded, the inner side notch 18 and the outer side notch 20 form a notched portion 22 whose cross section is triangle-shaped. The first ring 12 and the second ring 14 are bonded by an adhesive agent 24 that fills the recessed portion 16 and the notched portion 22. Since the notched portion 22, as well as the recessed portion 16, is also filled with the adhesive agent 24, the first ring 12 and the second ring 14 can be more tightly bonded. In the manufacturing of the ring type wearable terminal 40, after the first ring 12 and the second ring 14 are bonded, polishing is performed such that the surface of the adhesive agent 24 filling the notched portion 22 becomes smoothly continuous with the respective outer peripheral surfaces of the first ring 12 and the second ring 14.

Shown below is a variation of the second embodiment. A clear adhesive agent may be used as the adhesive agent 24. Alternatively, an adhesive agent colored in the same color as that of the first ring 12 and that of the second ring 14 may be used to conceal the notched portion 22. From the fashion's perspective, an adhesive agent colored in a color that is different from the color of the first ring 12 and the color of the second ring 14 may be used. The inner side notch 18 is formed on the first ring 12, and the outer side notch 20 is formed on the second ring 14. Alternatively, either one of the inner side notch 18 and the outer side notch 20 may be applied. Also, the inner side notch 18 and the outer side notch 20 may not be formed on the whole circumference of the rings and may be formed on at least a part of the respective rings. In either case, a notched portion to be filled with the adhesive agent 24 can be formed between the first ring 12 and the second ring 14 so as to bond the first ring 12 and the second ring 14 more tightly.

Described above is an explanation of the present invention based on the embodiments. These embodiments are intended to be illustrative only, and it will be obvious to those skilled in the art that various modifications to constituting elements and processes could be developed and that such modifications are also within the scope of the present invention.

For example, an explanation has been made regarding a ring type wearable terminal used as a ring. However, the example given is non-limiting. The diameter of the ring and the diameter of an inner diameter correction member may be increased to be used as a bracelet.

What is claimed is:
1. A wearable ring terminal comprising:
   a first ring that has a first side edge, a second side edge and a recessed portion formed between the first side edge and the second side edge on an outer surface of the first ring;
   a second ring that has an inner most circumferential surface that is bonded to the first ring and covers the recessed portion, the first side edge and the second side edge of the first ring contacting the inner most circumferential surface of the second ring; and
   a communication unit that is housed in the recessed portion of the first ring,
   wherein the communication unit is provided with a ring-shaped flexible substrate,
   wherein the flexible substrate is provided with a bonding portion formed such that the bonding portion can be bonded at a plurality of different positions in a longitudinal direction in accordance with a size of the wearable ring terminal,
   wherein an entirety of the first ring fits inside an area circumferentially surrounded by the inner most circumferential surface of the second ring,
   wherein the flexible substrate further comprising:
   a positioning portion that projects toward an outside from a side edge of each end portion of the flexible substrate in the longitudinal direction,
   wherein the positioning portion is formed such that the positioning portion can be overlapped at the plurality of different positions in the longitudinal direction, and
   wherein the bonding portion is formed such that the bonding portion can be bonded at a position where the positioning portion is overlapped.

2. The wearable ring terminal according to claim 1,
wherein the flexible substrate is provided with a plurality of linear patterns that extend in the longitudinal direction, and
wherein the bonding portion is formed at each end portion of the plurality of linear patterns.

3. The wearable ring terminal according to claim 2, wherein the plurality of linear patterns form a single loop antenna while the bonding portion is bonded.

4. The wearable ring terminal according to claim 2,
wherein the plurality of linear patterns are formed on opposite surfaces of the flexible substrate, and
wherein the flexible substrate is provided with a plurality of connection holes through which the plurality of linear patterns on the opposite surfaces are connected.

5. The wearable ring terminal according to claim 1, wherein
the first ring includes an inner side notch formed on a whole circumference of the first ring,
the inner side notch includes a first inclined surface formed such that an outer diameter of the first ring becomes smaller toward either of the first side edge and the second side edge of the first ring,
the second ring includes an outer side notch formed on a whole circumference of the second ring,
the outer side notch includes a second inclined surface formed such that an inner diameter of the second ring becomes larger toward a side edge of the second ring, and
the first ring and the second ring are bonded by an adhesive agent that fills a notch portion formed by the inner side notch of the first ring and the outer side notch of the second ring.

6. The wearable ring terminal according to claim 1, wherein
the first ring has a first width in an axial direction of the wearable ring terminal,
the second ring has a second width in the axial direction of the wearable ring terminal, and
the first width of the first ring is the same as the second width of the second ring.

7. The wearable ring terminal according to claim 1, wherein
the first ring and the second ring have the same color or a combination of different colors in complementary color relationship.

8. The wearable ring terminal according to claim 1, wherein the first ring and the second ring are formed of high-strength ceramics.

* * * * *